US012687774B2

(12) United States Patent
Hwang et al.

(10) Patent No.: US 12,687,774 B2
(45) Date of Patent: Jul. 21, 2026

(54) OVERLAY IMPROVEMENT METHOD, AND METHOD OF MANUFACTURING SEMICONDUCTOR DEVICE COMPRISING OVERLAY IMPROVEMENT METHOD

(71) Applicant: Samsung Electronics Co., Ltd., Suwon-si (KR)

(72) Inventors: Jonghyun Hwang, Suwon-si (KR); Jaeil Lee, Suwon-si (KR); Kyoungcho Na, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 355 days.

(21) Appl. No.: 18/532,757

(22) Filed: Dec. 7, 2023

(65) Prior Publication Data

US 2024/0310719 A1      Sep. 19, 2024

(30) Foreign Application Priority Data

Mar. 15, 2023    (KR) ........................ 10-2023-0034173

(51) Int. Cl.
G03F 1/70        (2012.01)
G03F 7/00        (2006.01)
H10P 74/20       (2026.01)

(52) U.S. Cl.
CPC ........... G03F 1/70 (2013.01); G03F 7/70504 (2023.05); G03F 7/70508 (2013.01); G03F 7/70516 (2013.01); G03F 7/706 (2013.01); H10P 74/203 (2026.01)

(58) Field of Classification Search
None
See application file for complete search history.

(56) References Cited

U.S. PATENT DOCUMENTS

| | | |
|---|---|---|
| 7,180,189 B2 | 2/2007 | Bowes |
| 7,261,983 B2 | 8/2007 | Smith et al. |
| 8,248,579 B2 | 8/2012 | Mos et al. |
| 9,189,705 B2 | 11/2015 | Jeong |
| 9,250,542 B2 | 2/2016 | Ishigo |
| 9,679,821 B2 | 6/2017 | Jung et al. |
| 10,809,633 B1 | 10/2020 | Yang et al. |

FOREIGN PATENT DOCUMENTS

KR     10-2012-0093723 A      8/2012

*Primary Examiner* — Anthony Ho
(74) *Attorney, Agent, or Firm* — Harness, Dickey & Pierce, P.L.C.

(57) ABSTRACT

An overlay correction method for improving an overlay parameter of an ultra-high order component includes: obtaining misalignment components of an overlay through measurement; converting the misalignment components into overlay parameters; applying a conversion logic between the overlay parameters; converting the overlay parameters into aberration input data; and performing an exposure process by applying the aberration input data to an exposure machine, wherein the overlay parameters are divided into a first overlay parameter shifting in a first direction that is an extending direction of a slit, and a second overlay parameter shifting in a second direction that is perpendicular to the first direction, and the performing of the exposure process includes correcting the first and second overlay parameters including a higher-order component of a 3rd order or greater with respect to a location of the slit in the first direction.

20 Claims, 25 Drawing Sheets

FIG. 1

START

OBTAIN MISALIGN COMPONENTS — S110

CONVERT MISALIGN COMPONENTS INTO OVERLAY PARAMETERS — S120

APPLY CONVERSION LOGIC TO OVERLAY PARAMETERS — S130

CONVERT OVERLAY PARAMETERS INTO ABERRATION INPUT DATA OF EXPOSURE MACHINE — S140

PERFORM EXPOSURE PROCESS BY APPLYING ABERRATION INPUT DATA TO EXPOSURE MACHINE — S150

END

REGISTER ABERRATION-WISE CONTROL SENSITIVITY
AND TARGET ——S142

OBTAIN ABERRATION MEASUREMENT VALUE
BY USING ABERRATION SENSOR ——S144

GENERATE LENS OPERATING MODEL,
BASED ON ABERRATION-WISE CONTROL SENSITIVITY,
TARGET, AND ABERRATION MEASUREMENT VALUE ——S146

FIG. 8

| HIGHER-ORDER COMPONENT IN X DIRECTION | Misalign | Parameter | |
|---|---|---|---|
| | | Overlay | C-Zernike |
| 3RD ORDER | dy | K20 | Z3_3 |
| 4TH ORDER | dx | K21 | Z2_4 |
| 4TH ORDER | dy | K30 | Z3_4 |
| 5TH ORDER | dx | K31 | Z2_5 |

1

OVERLAY IMPROVEMENT METHOD, AND METHOD OF MANUFACTURING SEMICONDUCTOR DEVICE COMPRISING OVERLAY IMPROVEMENT METHOD

CROSS-REFERENCE TO RELATED APPLICATION

This application is based on and claims priority under 35 U.S.C. § 119 to Korean Patent Application No. 10-2023-0034173, filed on Mar. 15, 2023, in the Korean Intellectual Property Office, the disclosure of which is incorporated by reference herein in its entirety.

BACKGROUND

Various example embodiments relate, in general, to an overlay correction method, and more particularly, to an overlay correction method for correcting an overlay parameter that includes a higher-order component.

With the gradual refinement of a line width of a semiconductor circuit, the number of layers using an extreme ultraviolet (EUV) machine is increasing. For example, a pattern of multiple layers is formed within one chip by using a combination of a deep ultraviolet (DUV) machine or photolithographic process and an EUV machine or photolithographic process. Meanwhile, the DUV machine and the EUV machine are largely different with respect to one or more of a wafer stage, a reticle, a slit, and an optical system, in addition to a difference that optical sources of different wavelengths are used. Due to a difference between machines in the combination of a DUV machine and an EUV machine, overlay misalignment occurs while forming a fine pattern.

SUMMARY

Various example embodiments may provide an overlay correction method for correcting or improving upon an overlay parameter of an ultra-high order component, and/or a method of manufacturing a semiconductor device including the overlay correction method.

Additional aspects will be set forth in part in the description which follows and, in part, will be apparent from the description, and/or may be learned by practice of one or more various example embodiments.

According to various example embodiments, there is provided an overlay improvement method including obtaining misalignment components of an overlay through measurement, converting the misalignment components into overlay parameters, applying a conversion logic between the overlay parameters, converting the overlay parameters, to which the conversion logic is applied, into aberration input data of an exposure machine, and performing an exposure process by applying the aberration input data to the exposure machine. The overlay parameters are divided into a first overlay parameter shifting in a first direction that corresponds to an extension direction of a slit used in the exposure process, and a second overlay parameter shifting in a second direction that is perpendicular to the first direction and corresponds to a scan direction of the exposure process. The performing of the exposure process comprises correcting the first and second overlay parameters, the first and second overlay parameters including a higher-order component of a 3rd order or greater with respect to a location of the slit in the first direction misalignment components misalignment components.

Alternatively or additionally according to various example embodiments, there is provided an overlay improvement method including obtaining misalignment components of an overlay through measurement, converting the misalignment components into overlay parameters, applying a conversion logic between the overlay parameters, registering a target, aberration-wise control sensitivity, and the overlay parameters, obtaining an aberration measurement value by using an aberration sensor, generating a lens operating model for adjusting at least one lens of an exposure machine, based on the target, the aberration-wise control sensitivity and the aberration measurement value, and performing an exposure process by adjusting the at least one lens of the exposure machine through the lens operating model. The overlay parameters are divided into a first overlay parameter shifting in a first direction that corresponds to an extension direction of a slit used in the exposure process, and a second overlay parameter shifting in a second direction that is perpendicular to the first direction and corresponds to a scan direction of the exposure process. The performing of the exposure process comprises correcting the first and second overlay parameters including a higher-order component of a 3rd order or greater with respect to a location of the slit in the first direction misalignment components misalignment components.

Alternatively or additionally according to various example embodiments, there is provided a method of manufacturing a semiconductor device, including obtaining misalignment components of an overlay through measurement, converting the misalignment components into overlay parameters, applying a conversion logic between the overlay parameters, converting the overlay parameters, to which the conversion logic is applied, into aberration input data of an exposure machine, performing an exposure process on a sample wafer by applying the aberration input data to the exposure machine, determining whether the overlay is enhanced, based on a set criterion, performing the exposure process on a device wafer in response to the set criterion being satisfied, and performing a subsequent semiconductor process on the device wafer. The overlay parameters are divided into a first overlay parameter shifting in a first direction that corresponds to an extension direction of a slit used in the exposure process, and a second overlay parameter shifting in a second direction that is perpendicular to the first direction and corresponds to a scan direction of the exposure process. The performing of the exposure process on the sample wafer or the device wafer comprises correcting the first and second overlay parameters including a higher-order component of a 3rd order or greater with respect to a location of the slit in the first direction misalignment components misalignment components.

BRIEF DESCRIPTION OF THE DRAWINGS

Various example embodiments will be more clearly understood from the following detailed description taken in conjunction with the accompanying drawings in which:

FIG. 1 is a conceptual diagram for describing an overlay correction method according to various example embodiments;

FIG. 8 is a table showing a conversion relationship between an aberration and an overlay parameter;

DETAILED DESCRIPTION OF VARIOUS EXAMPLE EMBODIMENTS

Figure 2A:
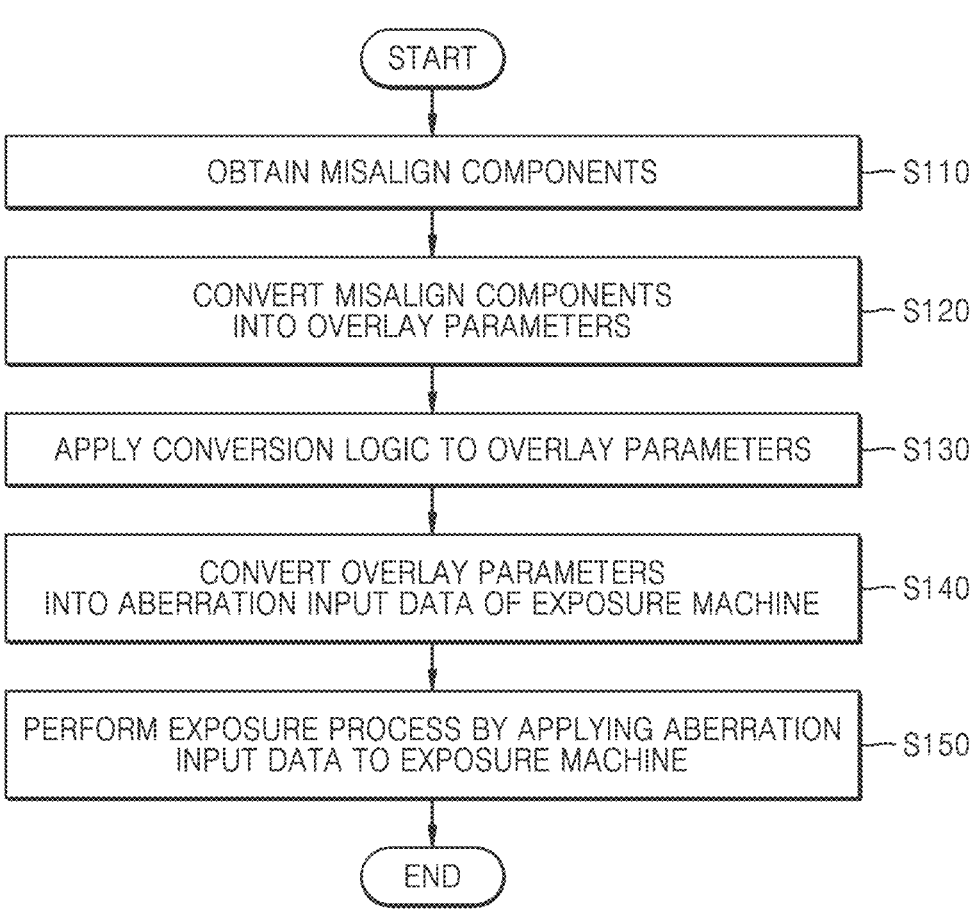
FIG. 2A is a flowchart of operations corresponding to the overlay correction method of FIG. 1.

Hereinafter, embodiments of the inventive concept will be described in detail with reference to accompanying drawings. In the drawings, like reference numerals are used for like elements and redundant descriptions thereof will be omitted.

Figure 1:
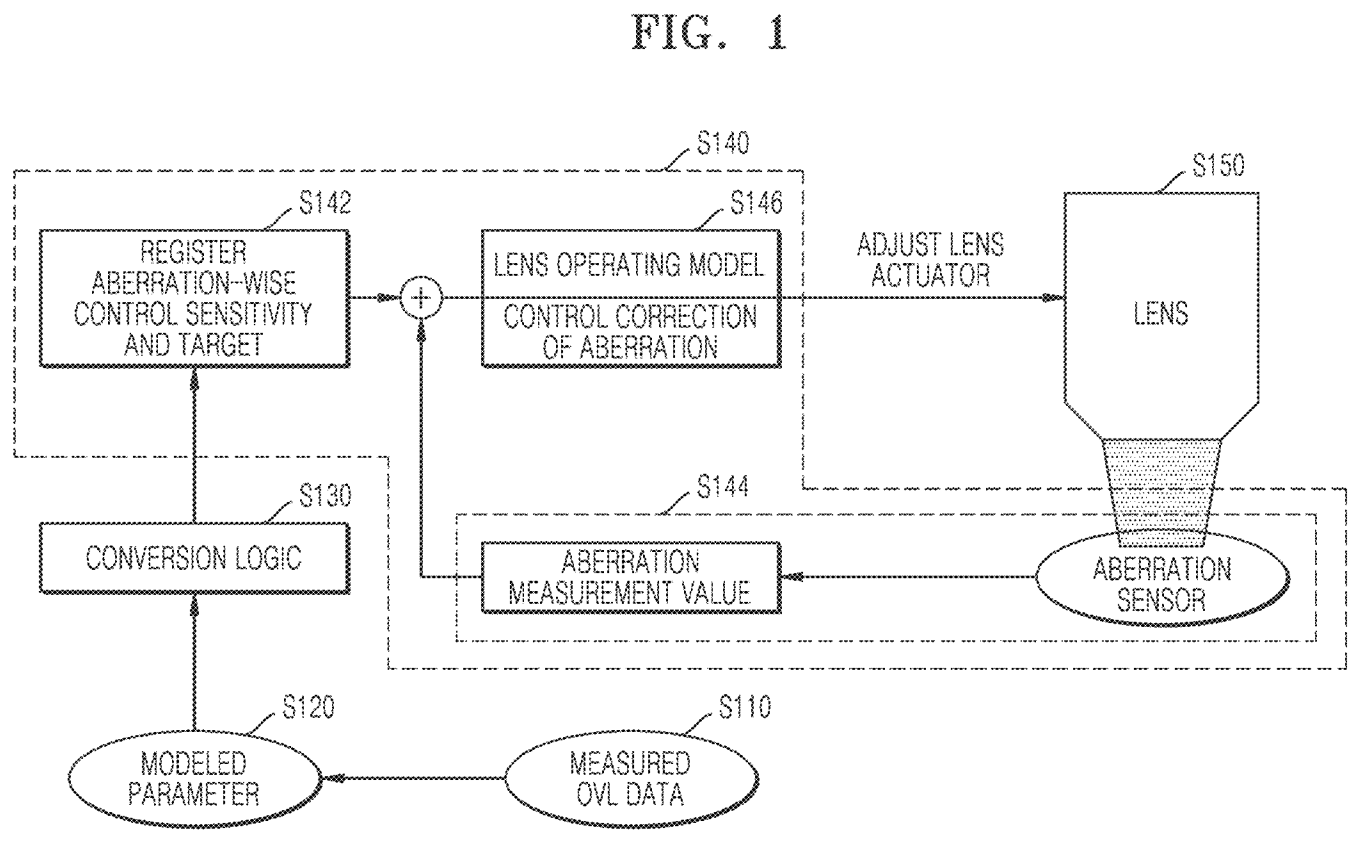
Figure 2B:
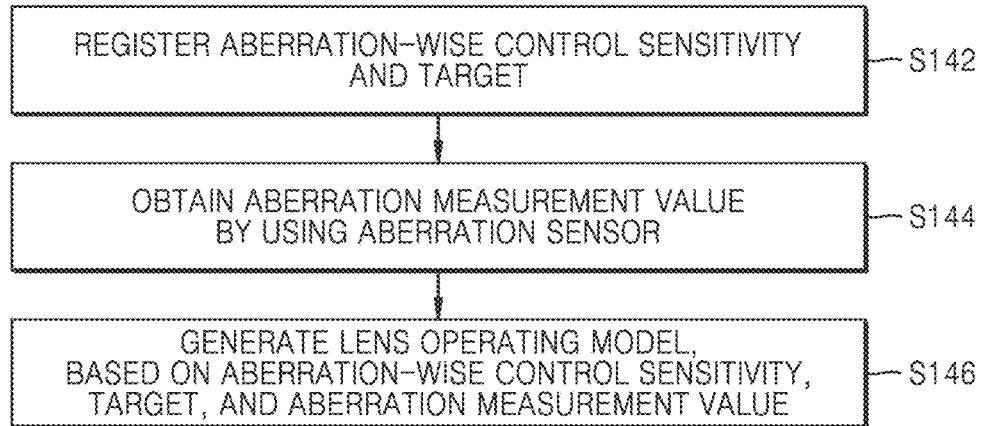
FIG. 2B is a detailed flowchart of operation S140 of the overlay correction method of FIG. 2A.
Figure 3:
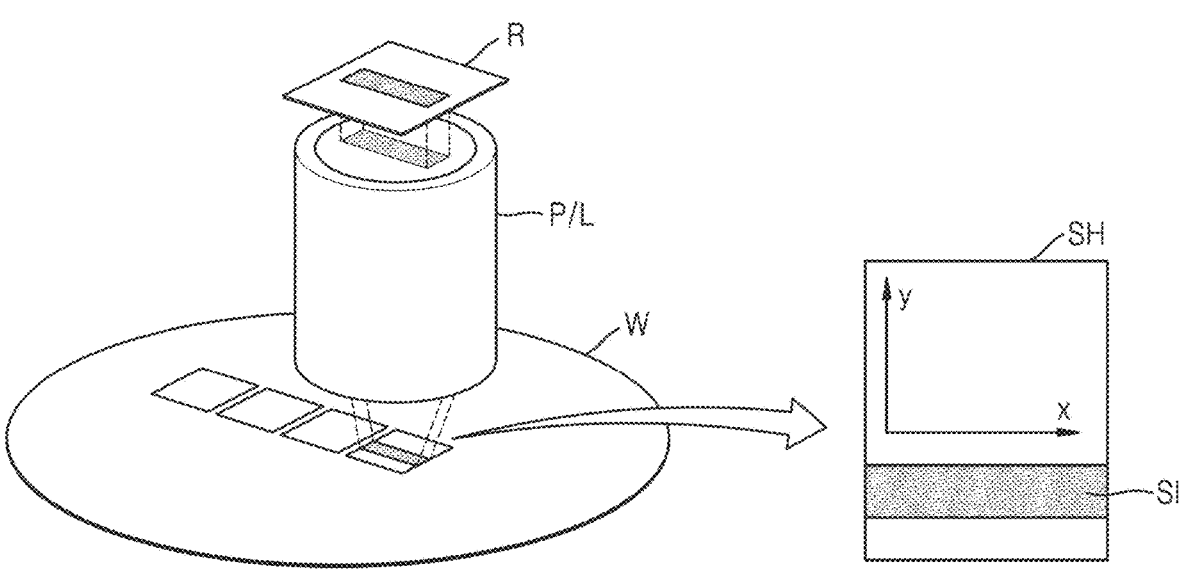
FIG. 3 is a conceptual diagram for describing concepts of a shot and a slit in an exposure process.

FIG. 1 is a conceptual diagram for describing an overlay correction method according to various example embodiments, FIG. 2A is a flowchart of operations corresponding to the overlay correction method of FIG. 1, and FIG. 2B is a detailed flowchart of operation S140 of the overlay correction method of FIG. 2A. FIG. 3 is a conceptual diagram for describing concepts of a shot and a slit in an exposure process.

Referring to FIGS. 1 through 3, the overlay correction method according to various example embodiments includes obtaining misalignment components of an overlay through measurement (operation S110). Here, the overlay indicates a degree of misalignment between two photolithographic processing steps, such as a previous step (e.g., an immediately preceding step) and a present step. The overlay is also referred to as an overlay error, and hereinafter, the overlay and the overlay error are collectively referred to as the overlay unless there is confusion. The overlay may be digitized by measuring an overlay key pattern, e.g., a box-in-box pattern, generated on a scribe lane and/or by obtaining a degree of misalignment or shift between patterns of the previous step and the present step on a cell array, e.g., the misalignment components, through the measurement.

Meanwhile, the overlay may be measured by using a relative measurement method and/or an absolute measurement method. Absolute measurement may denote measurement based on a fixed location. The fixed location may correspond to the origin of an absolute coordinate and does not change in the exposure process. For example, the fixed location may be or may correspond to a reference location on a wafer stage, separate from a semiconductor substrate (or semiconductor wafer) where an overlay key is formed. Meanwhile, relative measurement is a concept opposite to the absolute measurement, and may denote measurement based on a selective location. The selective location may change in the exposure process. For example, the selective location may be or may correspond to a point in the semiconductor substrate where the overlay key is formed. Consequently, the relative measurement may denote measurement of only a relative location between the selective location and a measurement location. The relative measurement method or the absolute measurement method will be described in more detail below with reference to FIGS. 5A and 5B.

Next, the misalignment components are converted into overlay parameters (operation S120). The overlay parameter expresses the overlay separately according to misalignment components. The overlay parameters may be largely divided into a first overlay parameter related to a component shifted from an anticipated location in an x direction, e.g., dx, and a second overlay parameter related to a component shifted from an anticipated location in a y direction, e.g., dy. Here, the x direction may denote an extending direction of a slit SI in the exposure process, and the y direction may correspond to a scan direction in a direction perpendicular to the x direction. For example, a size in which a pattern or pattern information on a reticle R is reduced and projected one time on a wafer W in the exposure process is defined as a shot SH (or a single shot SH). In FIG. 3, a portion corresponding to one shot SH on the wafer W is enlarged and shown at the right. One shot SH may correspond to an area on which light is irradiated while being scanned in the y direction through the slit SI, in the exposure process. In FIG. 3, P/L may denote projection lenses irradiating light from the reticle R onto the wafer W.

The overlay parameters will now be described in more detail. First, there are a number of overlay parameters, e.g., K1 through K6 overlay parameters of a constant or linear component. Here, K1, K3, and K5 may belong to the first overlay parameters, and K2, K4, and K6 may correspond to the second overlay parameters. When K1 through K6 are represented by dx and dy that are shifted components, $dx=K1$, $dx=K3*x$, $dx=K5*y$, $dy=K2$, $dy=K4*y$, and $dy=K6*x$.

Then, there are a number of overlay parameters, e.g., K7 through K12 that are overlay parameters of a 2nd order component. Here, K7, K9, and K11 may belong to the first overlay parameters, and K8, K10, and K12 may correspond to the second overlay parameters. When K7 through K12 are represented by dx and dy that are shifted components, $dx=K7*x^2$, $dx=K9*xy$, $dx=K11*y^2$, $dy=K8*y^2$, $dy=K10*yx$, and $dy=K12*x^2$. As used here, the order may correspond to the largest power in a monomial or polynomial expression of the overlay parameters related to either or both of direction x and direction y.

Then, there are a number of overlay parameters, e.g., K13 through K20 that are overlay parameters of a 3rd order component. Here, K13, K15, K17, and K19 may belong to the first overlay parameters, and K14, K16, K18, and K20 may correspond to the second overlay parameters. When K13 through K20 are represented by dx and dy that are shifted components, $dx=K13*x^3$, $dx=K15*x^2y$, $dx=K17*xy^2$, $dx=K19*y^3$, $dy=K14*y^3$, $dy=K16*y^2x$, $dy=K18*yx^2$, and $dy=K20*x^3$.

There may be K21, K30, and K31 related to the overlay correction method of various example embodiments, for overlay parameters of a component of 4th order or greater. Here, K21 and K31 may belong to the first overlay parameters and K30 may belong to the second overlay parameters. When K21, K30, and K31 are represented by dx and dy that are shifted components, $dx=K21*x^4$, $dx=K31*x^5$, and $dy=K30*x^4$.

In general, a 2nd order component or greater is referred to as a higher-order component and a 3rd order component or greater is referred to as an ultra-high order component. The overlay correction method according to various example embodiments may be related to overlay correction for patterns with a large process margin in the x direction and also related to correction of an overlay parameter of an ultra-high order component. Accordingly, the overlay correction method according to various example embodiments may be related to correction of the first overlay parameters of K1, K3, K7, K13, K21, and K31 and the second overlay parameters of K2, K6, K12, K20, and K30, in which only a location x of the slit SI in the x direction is a variable. The overlay correction method of various example embodiments may be specifically related to correction of the first overlay parameters of K21 and K31 and the second overlay parameters of K20 and K30, which are ultra-high order components. For example, the equations describing the first overlay parameters of K1, K3, K7, K13, K21, and K31 and the second overlay parameters of K2, K6, K12, K20, and K30 do not depend on y. The shifted components dx and dy of the first overlay parameters of K1, K3, K7, K13, K21, and K31 and the second overlay parameters of K6, K12, K20, and K30 will be described in more detail below with reference to FIGS. 4A and 4B.

After the misalignment components are converted into the overlay parameters, a conversion logic is applied to the overlay parameters (operation S130). Here, the conversion logic may be generated based on a correlation that is not independent between the overlay parameters. For example, when there is a ratio of a correlation or a correlation ratio of 1:α between a first overlay parameter A and a second overlay parameter B, a conversion logic of a relationship of correcting the first overlay parameter A by β/α, based on the correlation may be applied so as to correct the second overlay parameter B by β. The correlation between the overlay parameters and the conversion logic resulting therefrom will be described in more detail below with reference to FIGS. 10A through 12B.

Meanwhile, the correlation between the overlay parameters may correspond to aberration crosstalk with respect to a concept of aberration. The concept of aberration and a relationship between the aberration and the overlay parameter will be described in more detail below with reference to FIGS. 6A through 8.

Next, the overlay parameters, to which the conversion logic is applied, are converted into aberration input data of an exposure machine (operation S140). Aberration denotes a phenomenon in which an actual wavefront of light that transmitted through a lens differs from an ideal wavefront, for example due to a manufacture error of the lens. The aberration affects the overlay parameter and in particular, may affect the overlay parameter of an ultra-high order component. In various example embodiments, the overlay correction method may employ a principle of correcting a corresponding overlay parameter of an ultra-high order through correction of an aberration. Accordingly, in operation S140, the overlay parameters that require to be corrected are converted into data related to an aberration of the exposure machine, i.e., the aberration input data.

Referring to FIGS. 1 and 2B, operation S140 may include registering aberration-wise control sensitivity and a target (operation S142), obtaining an aberration measurement value by using an aberration sensor (operation S144), and generating a lens operating model based on the aberration-wise control sensitivity, the target, and the aberration measurement value (operation S146). Here, the aberration-wise control sensitivity may denote control sensitivity for each location in the slit SI in the x direction, with respect to an aberration that causes a shift of a pattern. Also, the target may denote a degree of correction required or used for each location in the slit SI in the x direction, with respect to the aberrations.

The lens operating model may denote a simulation or program for adjusting a lens by using an actuator for correction control of the aberration. Meanwhile, the aberration measurement value may be obtained through measurement using the aberration sensor, for light projected through the projection lenses P/L, immediately before the exposure process is performed. In operation S142, the overlay parameters to which the conversion logic is applied may be input as objects to be corrected through control of aberrations.

Next, the exposure process is performed by applying the aberration input data to the exposure machine (operation S150). Here, the applying of the aberration input data to the exposure machine may denote correcting of the aberration by adjusting all, some, or at least one of the lenses with the actuator, based on the lens operating model. Accordingly, the exposure process may be performed by using the projection lenses P/L in which the aberrations are corrected or improved upon. Also, when the aberrations of the projection lenses P/L are corrected, the overlay parameters of the ultra-high order component, which are to be corrected in the exposure process, may be corrected. Meanwhile, in the overlay correction method of various example embodiments, the exposure process may be performed on a sample wafer, e.g., a dummy wafer and/or a test wafer, instead of a device wafer where an actual device is formed, so as to test a degree of overlay correction. Accordingly, although not shown in FIG. 2A, the overlay correction method of various example embodiments may further include determining a degree of enhancement of the overlay after the exposure process. The determining of the degree of enhancement of the overlay will be described in detail below with reference to a method of FIG. 14 of manufacturing a semiconductor device.

In the overlay correction method of various example embodiments, the conversion logic is applied to the overlay parameter of the ultra-high order component, the overlay parameter is converted into the aberration input data of the exposure machine, and then the exposure process is performed by applying the aberration input data to the exposure machine, thereby correcting the overlay parameter of the ultra-high order component. For example, in the overlay correction method of various example embodiments, the conversion logic resulting from the correlation between the overlay parameters of the ultra-high order component is applied to the corresponding overlay parameters, thereby correcting the overlay parameters of the ultra-high order component of 3rd order or greater for the location of the slit SI in the x direction. In detail, the first overlay parameters of 4th order or greater for the location of the slit SI in the x direction and the second overlay parameters of 3rd order or greater for the location of the slit SI in the x direction may be corrected. Here, the first overlay parameter may denote an overlay parameter related to the component shifted from the anticipated location in the x direction, e.g., dx, and the second overlay parameter may denote an overlay parameter related to the component shifted from the anticipated location in the y direction, e.g., dy.

Figure 4A:
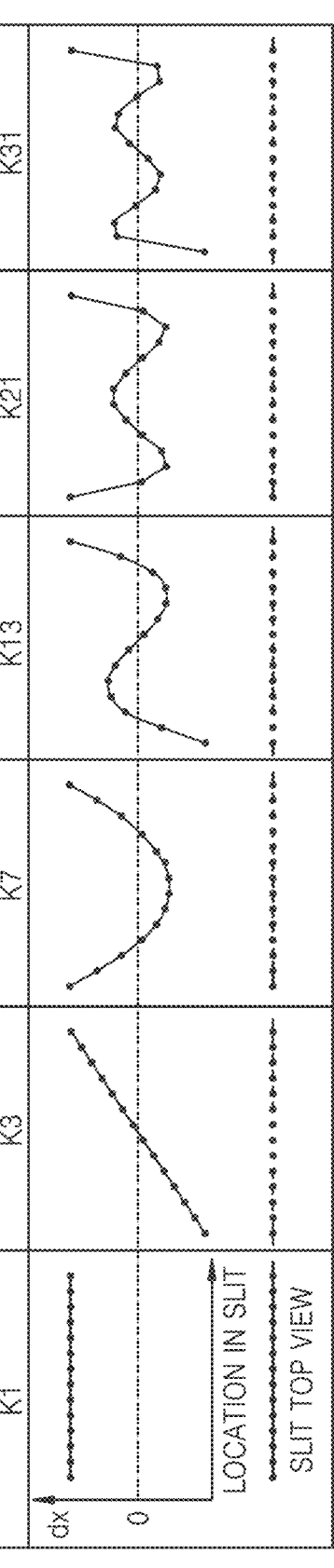
FIGS. 4A and 4B are conceptual diagrams visually illustrating overlay parameters related to the overlay correction method of FIG. 1.
Figure 4B:
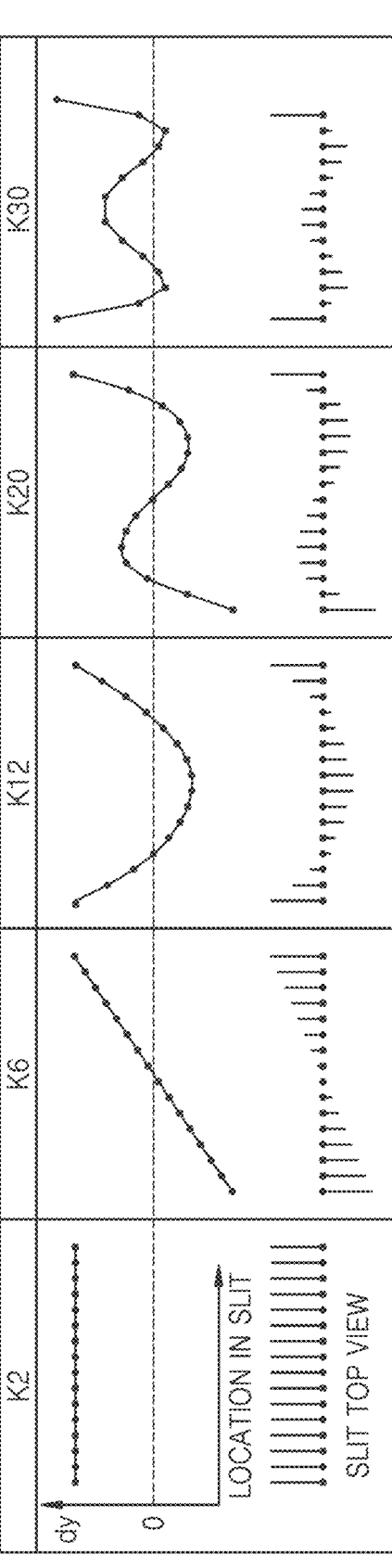

FIGS. 4A and 4B are conceptual diagrams visually illustrating overlay parameters related to the overlay correction method of FIG. 1. In FIGS. 4A and 4B, the x axis (the horizontal axis) denotes a location in a slit in the x direction, and the y axis (the vertical axis) denotes the components shifted from the anticipated location in the x direction and y direction, e.g., dx in FIG. 4A and dy in FIG. 4B. Also, a bottom of each graph shows a shape of the overlay parameter viewed from the top of the slit.

Referring to FIG. 4A, the overlay parameter of K1 may be constant, e.g., may show a shape biased in one direction, for example, a (+)x direction, regardless of the location x in in the slit. The overlay parameter of K3 may show a shape proportional to the location x in the slit. A location in which dx is 0 may correspond to a center of the slit in the x direction. The overlay parameter of K7 may show a shape proportional to the square of the location x in the slit. A location in which dx has a lowest value may correspond to the center of the slit in the x direction. The overlay parameter of K13 may show a shape proportional to the cube of the location x in the slit. A location at the center of locations in which dx is 0 may correspond to the center of the slit in the x direction. The overlay parameter of K21 may show a shape proportional to the fourth power of the location x in the slit, and the overlay parameter of K31 may show a shape proportional to the fifth power of the location x in the slit.

Meanwhile, when the shape of the overlay parameter is viewed from the top of the slit, a location of a dot may correspond to the anticipated location and a length of a segment extending from the dot may correspond to dx. Also, a segment extending from the dot to the right may denote (+)dx, and a segment extending from the dot to the left may denote (−)dx.

Referring to FIG. 4B, the overlay parameter of K2 may be constant, e.g., may show a shape biased in one direction, for example, a (+)y direction, regardless of the location x in in the slit. The overlay parameter of K6 may show a shape proportional to the location x in the slit. A location in which dy is 0 may correspond to the center of the slit in the x direction. The overlay parameter of K12 may show a shape proportional to the square of the location x in the slit. A location in which dy has a lowest value may correspond to the center of the slit in the x direction. The overlay parameter of K20 may show a shape proportional to the cube of the location x in the slit. A location at the center of locations in which dy is 0 may correspond to the center of the slit in the x direction. The overlay parameter of K30 may show a shape proportional to the fourth power of the location x in the slit.

Meanwhile, when the shape of the overlay parameter is viewed from the top of the slit, a location of a dot may correspond to the anticipated location and a length of a segment extending from the dot may correspond to dy. Also, a segment extending from the dot to the top may denote (+)dy, and a segment extending from the dot to the bottom may denote (−)dy.

Figure 5A:
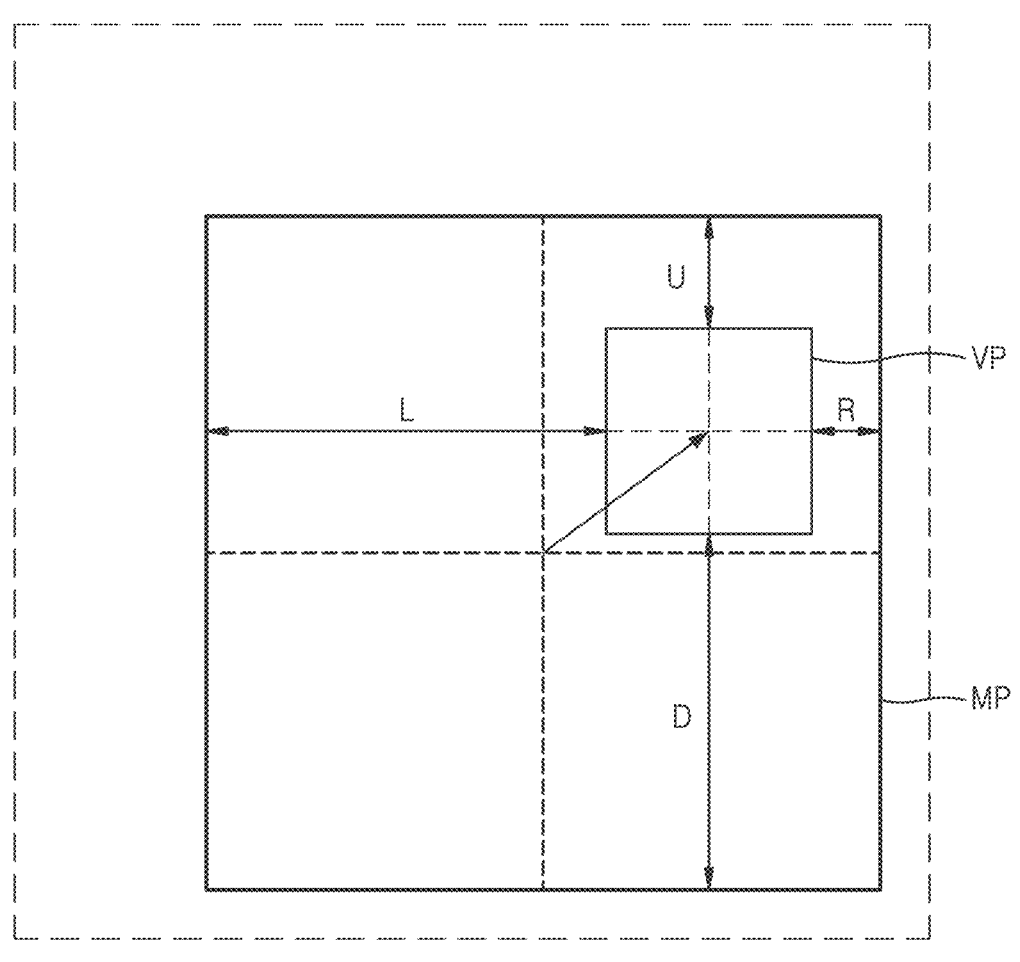
FIGS. 5A and 5B are conceptual diagrams for describing a relative measurement method and an absolute measurement method used for measurement of an overlay, in the overlay correction method of FIG. 1.
Figure 5B:
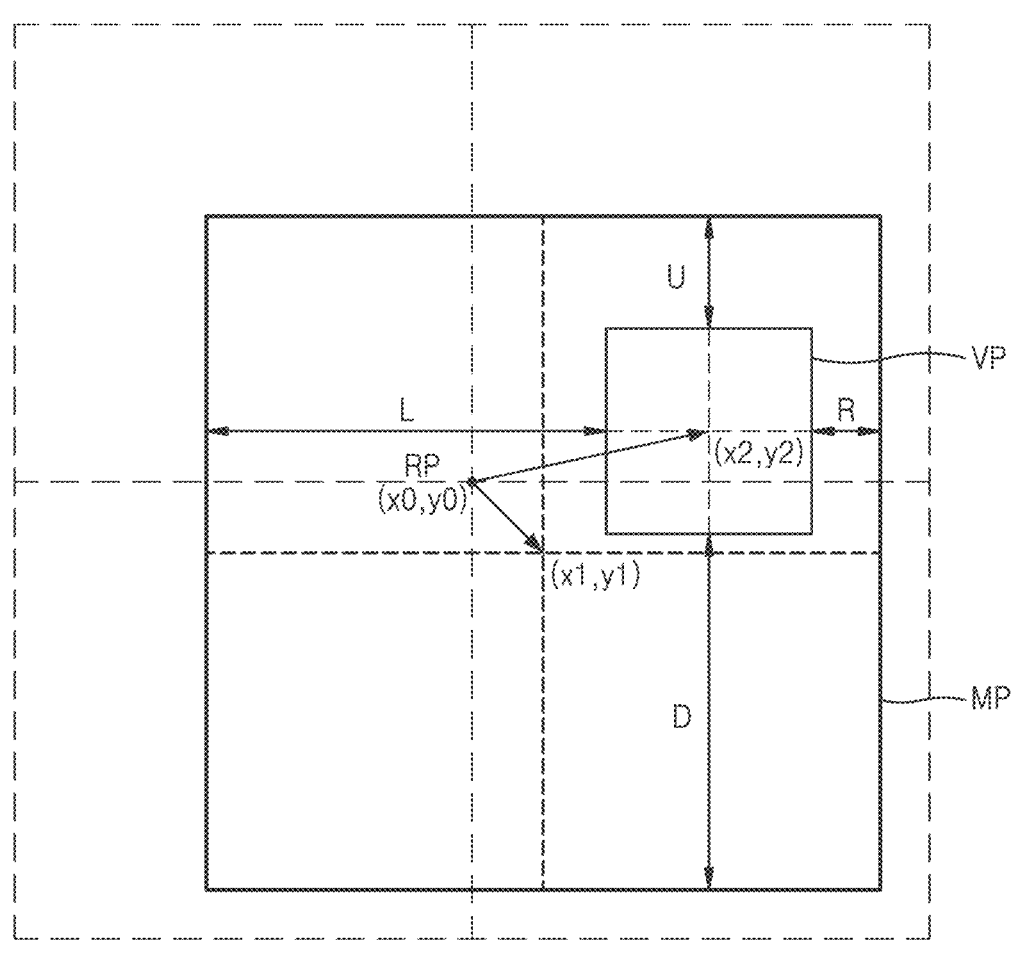

FIGS. 5A and 5B are conceptual diagrams for describing the relative measurement method and the absolute measurement method used for measurement of the overlay, in the overlay correction method of FIG. 1. In FIGS. 5A and 5B, outermost rectangles in broken lines conceptually illustrate fixed regions in the exposure process.

Referring to FIG. 5A, in the relative measurement, there is no reference location because only a relative location between a main pattern MP and a Vernier pattern VP is measured. A center of the main pattern MP may correspond to a selective location and a center of the Vernier pattern VP may correspond to a measurement location. In FIG. 5A, an x direction overlay Xol may be Xol=(L, −R)/2, and a y direction overlay Yol may be Yol=(U, −D)/2. Meanwhile, the main pattern MP and the Vernier pattern VP may be respectively referred to as an outer key and an inner key according to sizes and locations.

For reference, an overlay key used in overlay measurement may be largely classified as an image based overlay (IBO) key or a diffraction based overlay (DBO) key. Examples of the IBO key include a box-in-box (BIB) overlay key and/or an advanced image metrology (AIM) overlay key. FIGS. 5A and 5B may correspond to the BIB overlay key.

Meanwhile, in the relative measurement, when the main pattern MP of a previous step, e.g., an immediately previous step, is shifted from an ideal reference location where the main pattern MP should be, it is not possible to determine how much the main pattern MP is shifted. Accordingly, when subsequent steps increase, a size of misalignment of the overlay including a higher-order component may increase.

Referring to FIG. 5B, in the absolute measurement, locations of the main pattern MP and Vernier pattern VP are measured based on a reference location RP. Here, the reference location RP is an absolute location irrelevant to the semiconductor substrate where the overlay key is formed, and may be a location on the wafer stage. In FIG. 5B, the reference location RP is indicated by a black dot in a center portion of the rectangle in the broken lines, which is a fixed region, and the reference location RP may correspond to the fixed location. In FIG. 5B, the x direction overlay Xol may be Xol=(Vernier pattern x coordinate(x2)−x-axis reference location(x0))−(main pattern x coordinate(x1)−x-axis reference location(x0)). Also, the y direction overlay Yol may be Yol=(Vernier pattern y coordinate(y2)−y-axis reference location(y0))−(main pattern y coordinate(y1)−y-axis reference location(y0)).

The absolute measurement method may be performed on one layer. In other words, absolute measurement may be performed on each layer and each overlay key by performing absolute measurement on a main pattern of a lower layer, performing absolute measurement on a Vernier pattern of an upper layer, and so on. As such, in the absolute measurement method, how much a main pattern MP of the previous step (e.g., an immediately previous photolithographic/etching step) and a Vernier pattern VP of the present step are shifted from the absolute reference location are calculated through the measurement, and thus more accurate misalignment measurement on the overlay including the higher-order component may be possible. For reference, such absolute measurement may be performed by detecting a signal for a corresponding pattern and calculating a location through signal processing.

Figure 6A:
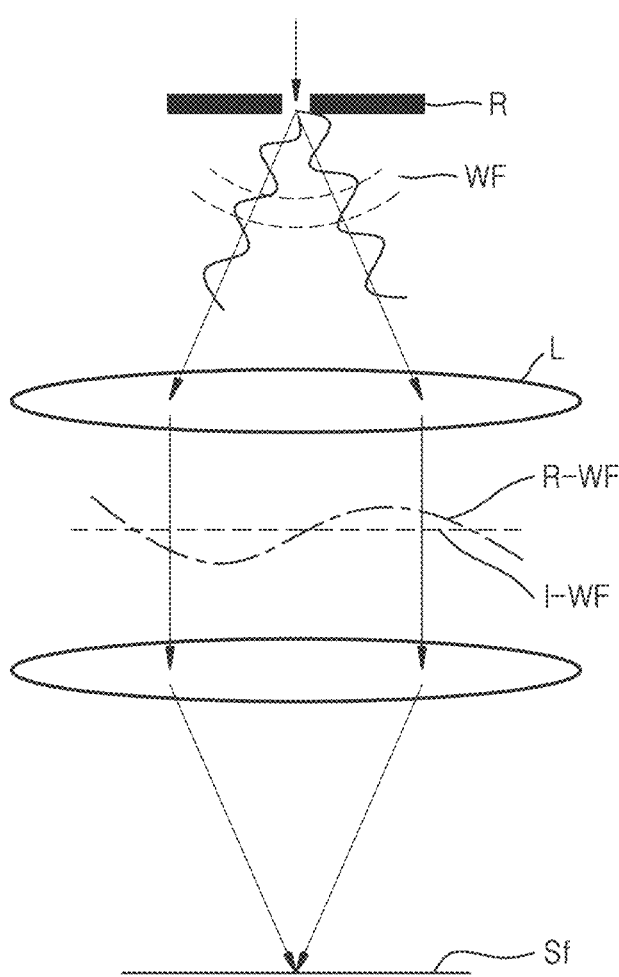
FIGS. 6A and 6B are conceptual diagrams for describing a concept of an aberration and a relationship between the aberration and an overlay.
Figure 6B:
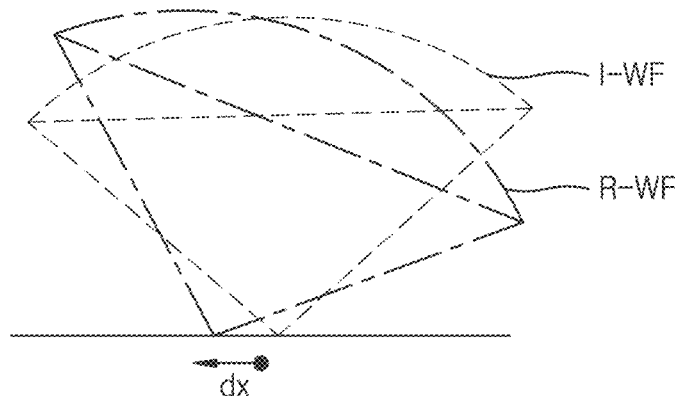

FIGS. 6A and 6B are conceptual diagrams for describing the concept of the aberration and the relationship between the aberration and the overlay.

Referring to FIGS. 6A and 6B, in optical lithography, light diffracted by a pattern of the reticle R may be transmitted through a lens L, and exposure may be performed as constructive and destructive interference occur on a wafer. The wafer may have photoresist on a top surface thereof. A same phase of the diffracted light is defined as a wavefront (WF). When the diffracted light passes through the lens L, a real WF R-WF may differ from an ideal WF I-WF, for example due to a manufacture error or the like of the lens L. In FIG. 6A, the real WF R-WF is indicated by an alternated long and short dash line, and the ideal WF I-WF is indicated by a broken line. A difference between the real WF R-WF and the ideal WF I-WF is referred to as an aberration, and due to such an aberration, an exposure location on a wafer surface Sf may vary. For example, as shown in FIG. 6B, a location where the diffracted light gathers on the wafer surface Sf may change by dx due to the aberration.

Figure 7A:
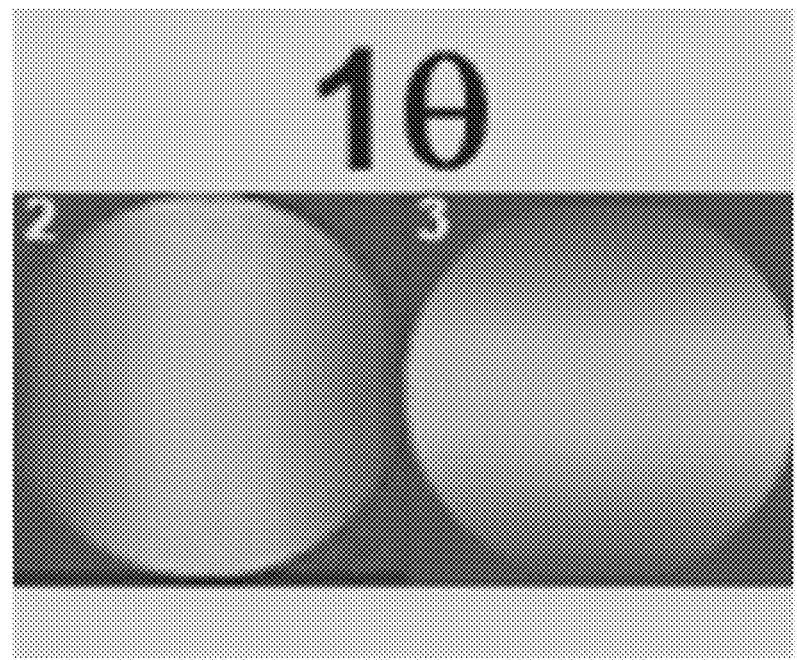
FIGS. 7A and 7B are conceptual diagrams for describing conversion between an aberration and an overlay parameter.
Figure 7B:
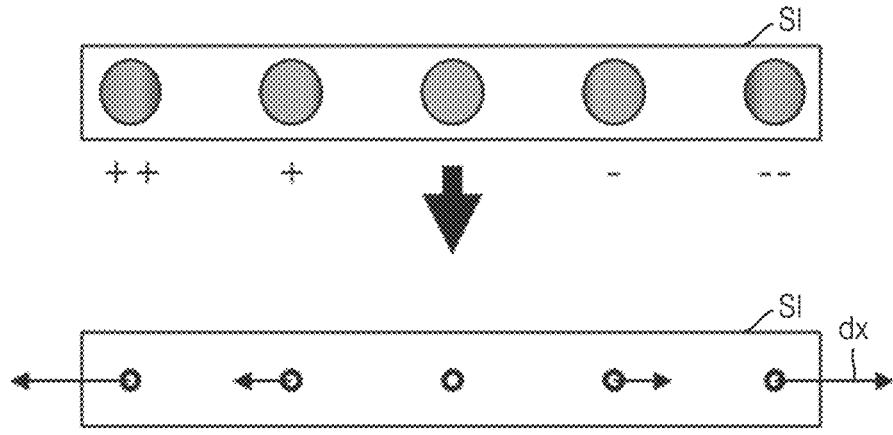

FIGS. 7A and 7B are conceptual diagrams for describing conversion between the aberration and the overlay parameter, and FIG. 8 is a table showing a conversion relationship between the aberration and the overlay parameter.

Referring to FIG. 7A, the aberration may be generally represented by various parameters, e.g., by Zernike parameters, by using Zernike polynomials. The Zernike parameters may affect the exposure location on the wafer surface Sf to be changed. The Zernike parameters may be analyzed as an offset or bias (or constant) component, a 1st order linear component, or a nonlinear component of 2nd order or greater of an overlay, according to a size and shape of an aberration for each location of a slit.

FIG. 7A shows a shape of aberration corresponding to a 1st order component, which largely affects the overlay parameter among the Zernike parameters. In detail, a shape of aberration indicated by 2 at the left may correspond to Zernike parameter no. 2 corresponding to a component (dx) shifted in the x direction, e.g., the first overlay parameter, and a shape of aberration indicated by 3 at the right may correspond to Zernike parameter no. 3 corresponding to a component (dy) shifted in the y direction, e.g., the second overlay parameter. For reference, when the aberration is represented in a circle, a shape of aberration of Zernike parameters may be represented by a radius r and an angle θ. Here, r may correspond to a distance from a center of WF, and θ may denote an angle with the x axis in a counterclockwise direction. For example, 0θ may denote that an aberration is independent from θ, and 1θ may denote that an aberration is dependent on a 1st order linear component. For example, the Zernike parameter no. 2 and Zernike parameter no. 3 indicated by 1θ in FIG. 7A may have different aberrations according to a location in the x direction and a location in the y direction. In addition, there may be components indicated by 20 to 50, in which an aberration is dependent on a nonlinear component of 2nd order or greater. However, this is not greatly related to the overlay correction or improvement method of various example embodiments, and thus, detailed descriptions thereof are omitted.

Referring to FIG. 7B, a complex (C)-Zernike parameter, in which a Zernike parameter and a shape for each slit location in the x direction are combined, may be used to represent a shape of each aberration for each slit location in the x direction. For example, as shown in FIG. 7B, a 1st order linear component for each slit location in the x direction of the Zernike parameter no. 2 inducing dx may be represented as C-Zernike parameter called Z2_1. The C-Zernike parameter of Z2_1 may correspond to the overlay parameter of K3.

FIG. 8 shows a conversion relationship between a C-Zernike parameter and an ultra-high order overlay parameter to be corrected in the overlay correction method of various example embodiments. In detail, misalignment for each slit location in the y direction is indicated by dy, and the overlay parameter of K20 proportional to the third power of the location x of the slit in the x direction may be converted into a C-Zernike parameter of Z3_3. Misalignment for each slit location in the x direction is indicated by dx, and the overlay parameter of K21 proportional to the fourth power of the location x of the slit in the x direction may be converted into a C-Zernike parameter of Z2_4. Misalignment for each slit location in the y direction is indicated by dy, and the overlay parameter of K30 proportional to the fourth power of the location y of the slit in the y direction may be converted into a C-Zernike parameter of Z3_4. Misalign for each slit location in the x direction is indicated by dx, and the overlay parameter of K31 proportional to the fifth power of the location x of the slit in the x direction may be converted into a C-Zernike parameter of Z2_5.

For reference, in a general exposure machine, K1, K3, K7, and K13, which are the first overlay parameters, and K2, K6, and K12, which are the second overlay parameters, may be provided as overlay inputs. Here, the providing of the overlay inputs may indicate that control data for correcting the overlay parameter is input to the exposure machine and the overlay parameter is corrected during the exposure process by the exposure machine. Meanwhile, the control data may be input after being converted into aberration input data. For example, the first overlay parameters of K1, K3, K7, and K13 may be respectively converted into C-Zernike parameters of Z2_0, Z2_1, Z2_2, and Z2_3, and the second overlay parameters of K2, K6, and K12 may be respectively converted into C-Zernike parameters of Z3_0, Z3_1, and Z3_2.

Figure 9A:
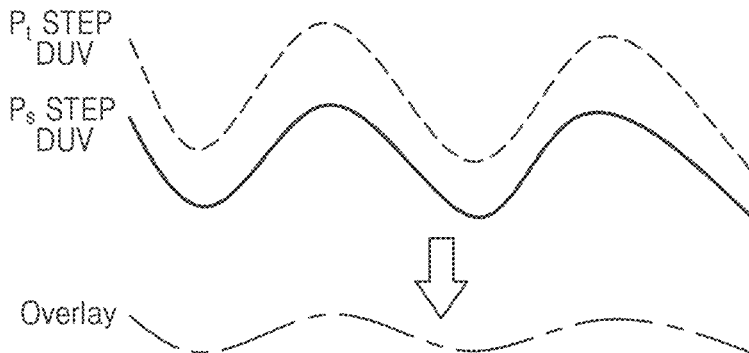
FIG. 9A is a conceptual diagram showing an overlay according to a same exposure machine.
Figure 9B:
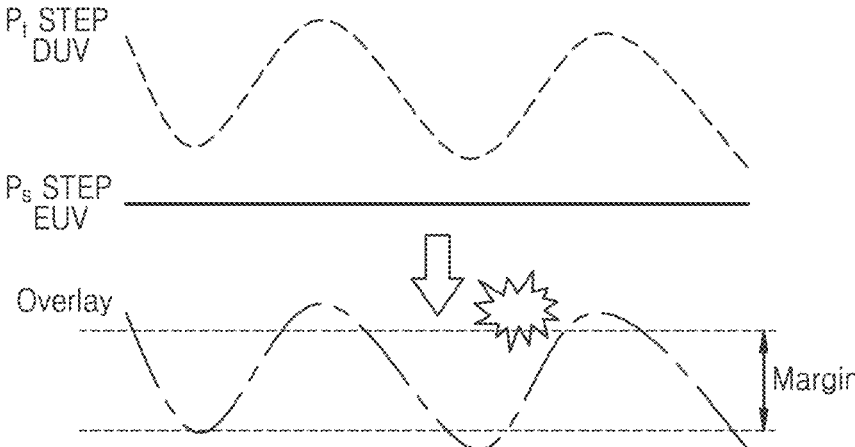
FIG. 9B is a conceptual diagram showing an overlay according to different exposure machines.

FIG. 9A is a conceptual diagram showing an overlay according to a same exposure machine, and FIG. 9B is a conceptual diagram showing an overlay according to different exposure machines.

Referring to FIGS. 9A and 9B, generally in the exposure machine, up to 3rd order of the first overlay parameter (dx) and up to 2nd order of the second overlay parameter (dy) for each location of the slit in the x direction are input as control inputs of the overlay parameter. However, due to a difference in aberration-wise sensitivity between patterns of a previous step Ps STEP, e.g., an immediately previous photolithographic step, and a present step Pt STEP, and a difference in aberration between exposure machines, an overlay parameter of a higher-order component greater than a controllable overlay parameter is generated. In particular, when an overlay between the previous step Ps STEP and the present step Pt STEP is a matched machine overlay (MMO) of extreme ultraviolet (EUV) and deep UV (DUV) having different optical structures of exposure machines, quality may deteriorate as a misalign margin of a new product is decreased.

FIG. 9A illustrates an overlay when the exposure process is performed through a DUV exposure machine in the previous step Ps STEP and the exposure process is performed through the DUV exposure machine in the present step Pt STEP. For example, because the same DUV exposure machine may be used in both steps, an aberration or distortion of light is similar, and thus, the overlay may not be big.

FIG. 9B illustrates an overlay when the exposure process is performed through an EUV exposure machine in the previous step Ps STEP and the exposure process is performed through a DUV exposure machine in the present step Pt STEP. For example, because different exposure machines are used, an aberration and/or distortion of light may be completely different, and thus, the overlay error may be big. For reference, in the EUV exposure machine, light is transmitted or reflected through a mirror instead of a lens, and thus, there may be barely any aberration and/or distortion of light, and accordingly, as shown in FIG. 9B, the aberration or distortion of light is indicated in a linear shape. On the other hand, in the DUV exposure machine, aberration or distortion of light may be generated due to some, all, or at least one of a plurality of lenses. Accordingly, the overlay corresponding to the difference in aberration or distortion between the different exposure machines may be large as shown in the lower portion of FIG. 9B. For example, the overlay may be outside a process margin indicated by broken lines in upper and lower portions. Such an issue may identically occur when the exposure process is performed through the DUV exposure machine in the previous step Ps STEP and the exposure process is performed through the DUV exposure machine in the present step Pt STEP.

An overlay component of an ultra-high order is unable to be provided as an input value for correcting an overlay parameter in the general exposure machine, and thus, a control method through aberration, wherein a misalign level of an overlay is converted into the form of aberration and applied to the exposure machine as an input, is used. However, in the overlay component of the ultra-high order, a component (dx) shifted in an x direction of a pattern and a component (dy) shifted in a y direction of the pattern do not behave independently, and in addition, a phenomenon in which the component (dy) shifted in the y direction is not normally controlled by the exposure machine is identified. Thus, hereinafter, a method of correcting or improving an overlay component of an ultra-high order, based on a correlation between overlay parameters including an ultra-high order component and a conversion logic according to the correlation will be described.

Figure 10A:
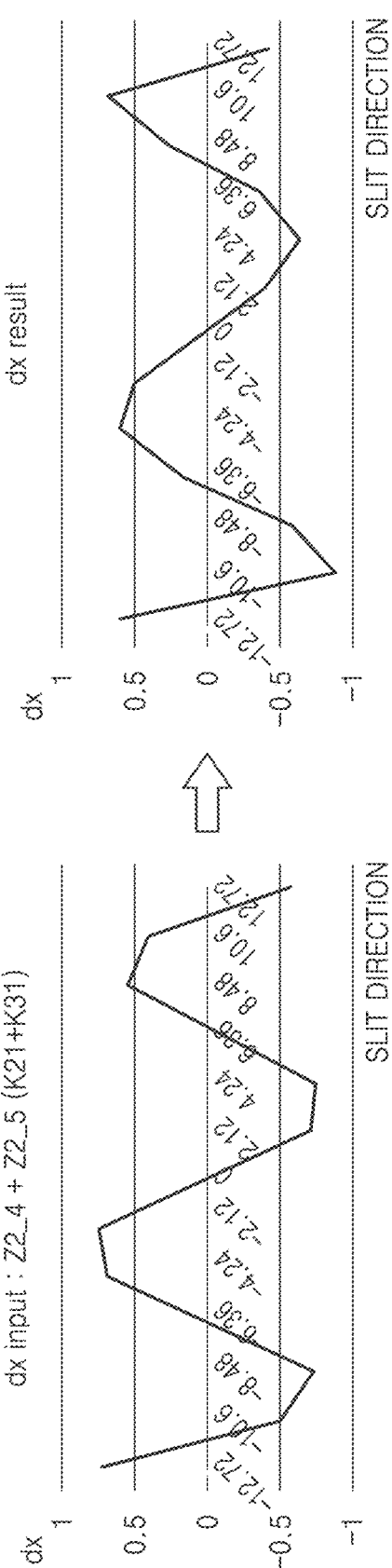
FIGS. 10A and 10B are graphs showing correlations between inputs and outputs of a first overlay parameter of a 4th order component and a first overlay parameter of a 5th order component.
Figure 10B:
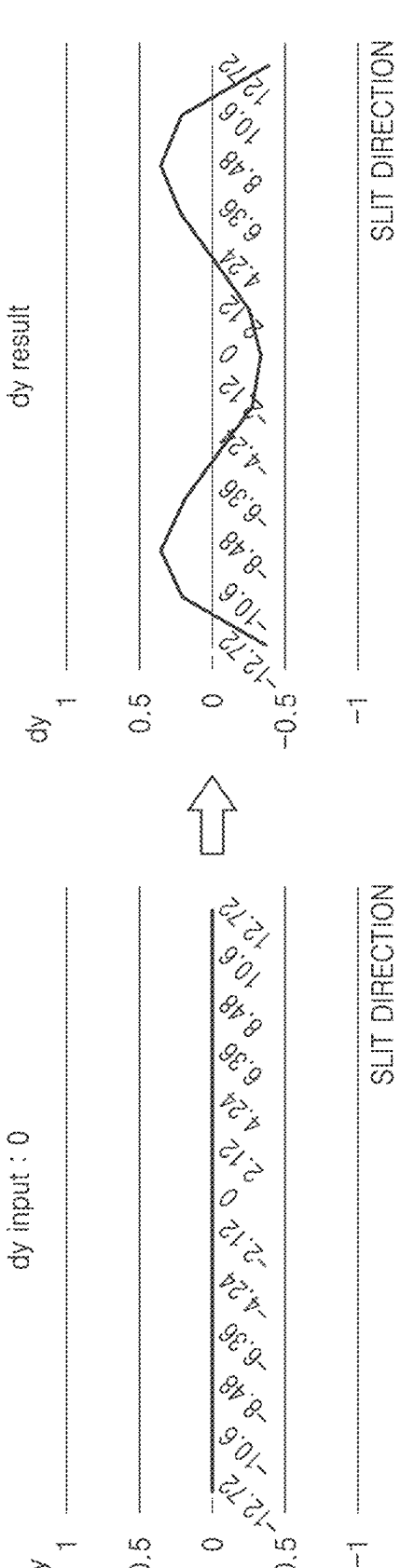

FIGS. 10A and 10B are graphs showing correlations between inputs and outputs of the first overlay parameter (K21) of a 4th order component and the first overlay parameter (K31) of a 5th order component. In the graphs of FIGS. 10A and 10B, a slit direction in the x axis (horizontal axis) may correspond to an x direction that is an extending or extension direction of a slit, a location of 0 may correspond to a center of the slit, and a unit along the horizontal axis may correspond to an arbitrary unit. In the graphs of FIG. 10A, dx in the y axis (vertical axis) may correspond to a component shifted in the x direction of a pattern, in the graphs of FIG. 10B, dy in the y axis (vertical axis) may correspond to a component shifted in a y direction of the pattern, and units thereof may correspond to an arbitrary unit. Also, in FIGS. 10A and 10B, the left graph indicates an input to an exposure machine and the right graph indicates an output of the exposure machine.

Referring to FIGS. 10A and 10B, when the C-Zernike parameters of Z2_4 and Z2_5 corresponding to K21 and K31 are input to the exposure machine as the aberration input data, as indicated in the left graph of FIG. 10A, dx according to the slit direction is output from the exposure machine as indicated by the right graph. As a result, it is determined that the graphs of inputs and outputs of dx have somewhat similar shapes. Accordingly, it may be predicted that the overlay parameters of K21 and K31 have a high correlation between the input and the output. Here, the output of exposure machine may denote an overlay result when the exposure process is performed with the aberration input data.

Meanwhile, despite that the input of dy to the exposure machine is 0 as shown in the left graph of FIG. 10B, dy according to the slit direction is output from the exposure machine as indicated by the right graph. As a result, for the overlay parameters of K21 and K31, it may be predicted that the input of dx affects the output of dy.

Figure 11A:
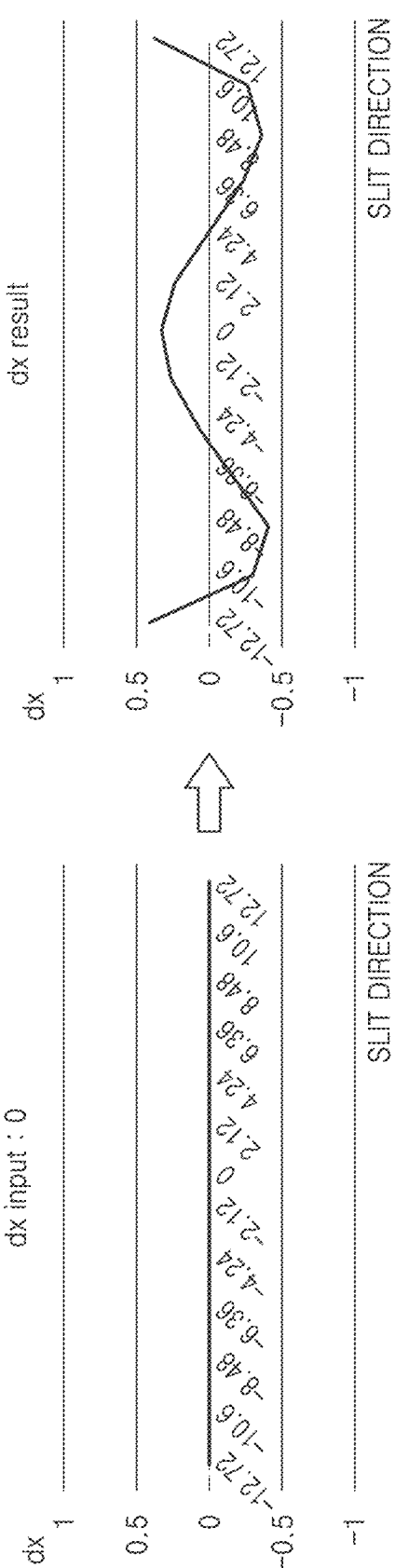
FIGS. 11A and 11B are graphs showing correlations between inputs and outputs of a second overlay parameter of a 3rd order component and a second overlay parameter of a 4th order component.
Figure 11B:
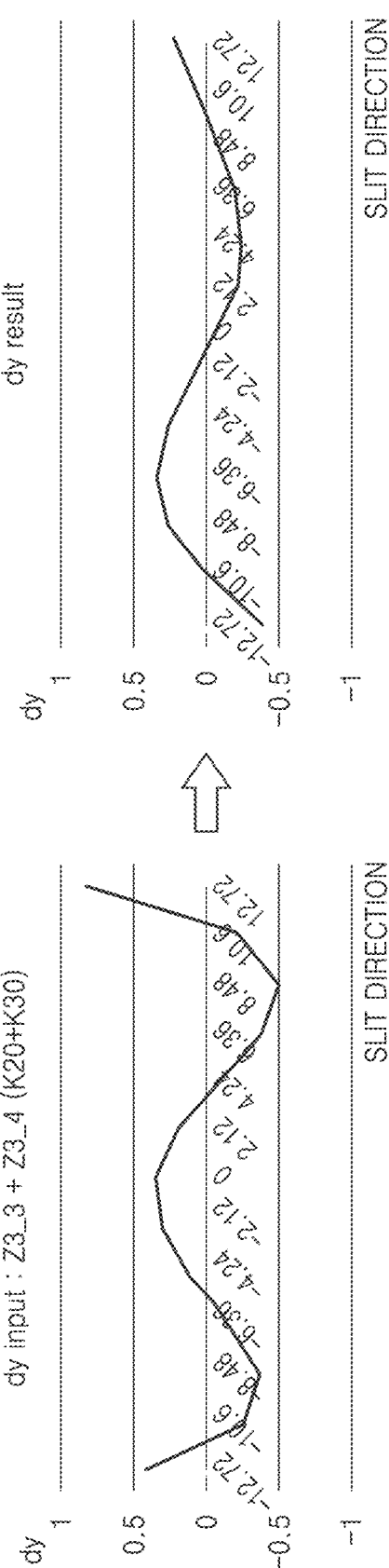

FIGS. 11A and 11B are graphs showing correlations between inputs and outputs of the second overlay parameter (K20) of a 3rd order component and the second overlay parameter (K30) of a 4th order component. In the graphs of FIGS. 11A and 11B, a slit direction in the x axis may correspond to an x direction that is an extending direction of a slit, a location of 0 may correspond to a center of the slit, and a unit may correspond to an arbitrary unit. In the graphs of FIG. 11A, dx in the y axis (vertical axis 0 may correspond to a component shifted in the x direction of a pattern, in the graphs of FIG. 11B, dy in the y axis (vertical axis) may correspond to a component shifted in a y direction of the pattern, and units thereof may correspond to an arbitrary unit. Also, in FIGS. 11A and 11B, the left graph indicates an input to an exposure machine and the right graph indicates an output of the exposure machine.

Referring to FIGS. 11A and 11B, when the C-Zernike parameters of Z3_3 and Z3_4 corresponding to K20 and K30 are input to the exposure machine as the aberration input data, as indicated in the left graph of FIG. 11B, dy according to the slit direction is output from the exposure machine as indicated by the right graph. It is identified that the right output graph is largely different from the left input graph. Accordingly, it may be predicted that the overlay parameters of K20 and K30 have a low correlation between the input and the output.

Meanwhile, despite that the input of dx to the exposure machine is 0 as shown in the left graph of FIG. 11A, dx according to the slit direction is output from the exposure machine as indicated by the right graph. As a result, for the overlay parameters of K20 and K30 as well, it may be predicted that the input of dy somewhat affects the output of dx.

Figure 12A:
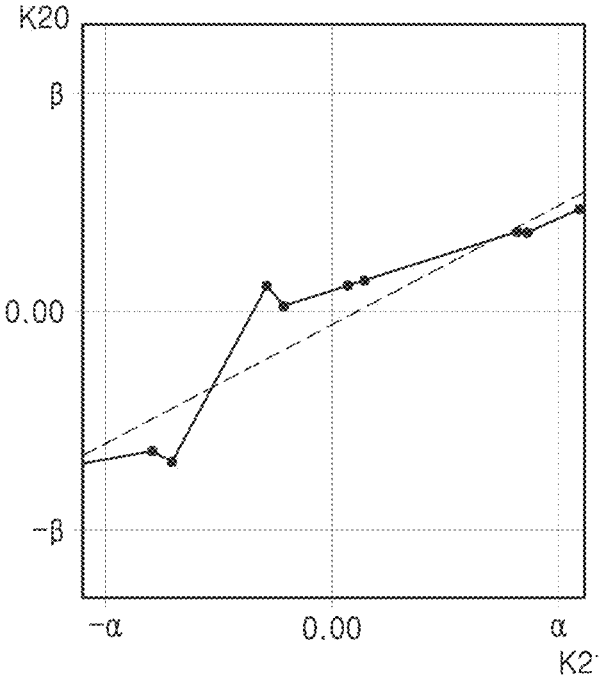
FIGS. 12A and 12B are graphs showing a correlation between a first overlay parameter of a 4th order component and a second overlay parameter of a 3rd order component, and a correlation between a first overlay parameter of a 5th order component and a second overlay parameter of a 4th order component.
Figure 12B:
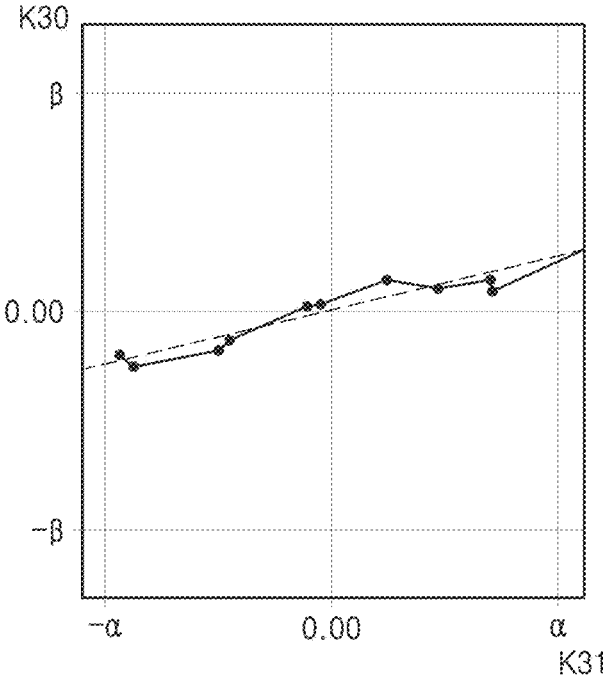

FIGS. 12A and 12B are graphs showing a correlation between the first overlay parameter (K21) of a 4th order component and the second overlay parameter (K20) of a 3rd order component, and a correlation between the first overlay parameter (K31) of a 5th order component and the second overlay parameter (K30) of a 4th order component.

Referring to FIG. 12A, in the graph of FIG. 12A, the x axis (horizontal axis) indicates the overlay parameter of K21 as an output of the exposure machine, the y axis (vertical axis) indicates the overlay parameter of K20 as an output of the exposure machine, and $\alpha$ and $\beta$ of the x axis and y axis may both correspond to an arbitrary unit. Meanwhile, in the graph of FIG. 12A, the solid line indicates actual data and the broken line indicates an average gradient. Meanwhile, the overlay parameter of K21 may correspond to the input of the exposure machine.

In the graph of FIG. 12A, for example, when the average gradient is about A, it is exhibited that there is a ratio of a correlation of 1:A between the overlay parameters of K21 and K20. For reference, A may be equal to or less than 1. Such a result of the correlation may indicate that the overlay parameter of K20 may be corrected by A when the overlay parameter of K21 is corrected by 1. The ratio of correlation may be variously changed according to the exposure machine. For example, in the overlay correction method of various example embodiments, the overlay parameters of K21 and K20 may have a ratio of correlation within a range of about 1:0.9 to about 1:0.1.

Referring to FIG. 12B, in the graph of FIG. 12B, the x axis indicates the overlay parameter of K31, the y axis indicates the overlay parameter of K30, and α and β of the x axis and y axis may both correspond to an arbitrary unit. Meanwhile, in the graph of FIG. 12B, the solid line indicates actual data and the broken line indicates an average gradient. Meanwhile, the overlay parameter of K31 may correspond to the input of the exposure machine.

In the graph of FIG. 12B, for example, when the average gradient is about B, it is exhibited that there is a ratio of a correlation of 1:B between the overlay parameters of K31 and K30. For reference, B may be equal to or less than 1. Such a result of the correlation may indicate that the overlay parameter of K30 may be corrected by B when the overlay parameter of K31 is corrected by 1. The ratio of correlation may be variously changed according to the exposure machine. For example, in the overlay correction method of various example embodiments, the overlay parameters of K31 and K30 may have a ratio of correlation within a range of about 1:0.9 to about 1:0.1.

Meanwhile, in the general exposure machine, the component (dy) shifted in the y direction, i.e., the second overlay parameter, may not be normally controlled. This indicates that a process margin for the second overlay parameter is very insufficient in the exposure process. Also, an issue of process margin insufficiency of a second overlay parameter of an ultra-high order component is intensified together with refinement of a pattern. In addition, as described above, for a new product indicating MMO of EUV and DUV, insufficiency of a second overlay parameter may lead to poor quality.

According to the overlay correction or improvement method of various example embodiments, the insufficiency of process margin of the second overlay parameter of the ultra-high order component described above may be prevented or reduced by generating the conversion logic, based on the correlation between the overlay parameters, applying the conversion logic to the overlay parameters, converting the overlay parameters into the aberration input data, and then performing the exposure process by inputting the aberration input data to the exposure machine. In the present exposure machine, a process margin of the component (dx) shifted in the x direction, e.g., the first overlay parameter, may generally be relatively large. Accordingly, when the first overlay parameter of the ultra-high order component is corrected, the second overlay parameter of the ultra-high order component having a correlation therewith may be corrected. For example, the first overlay parameter of K21 of a 4th order component may be corrected to correct the second overlay parameter of K20 of a 3rd order component having a correlation therewith. Also, the first overlay parameter of K31 of a 5th order component may be corrected to correct the second overlay parameter of K30 of a 4th order component having a correlation therewith. Alternatively or additionally, as described above, the ratio of correlation may vary depending on exposure machines, and the conversion logic and the conversion into the aberration input data according to the conversion logic may also vary depending on aberration values and values of measured overlays.

Figure 13A:
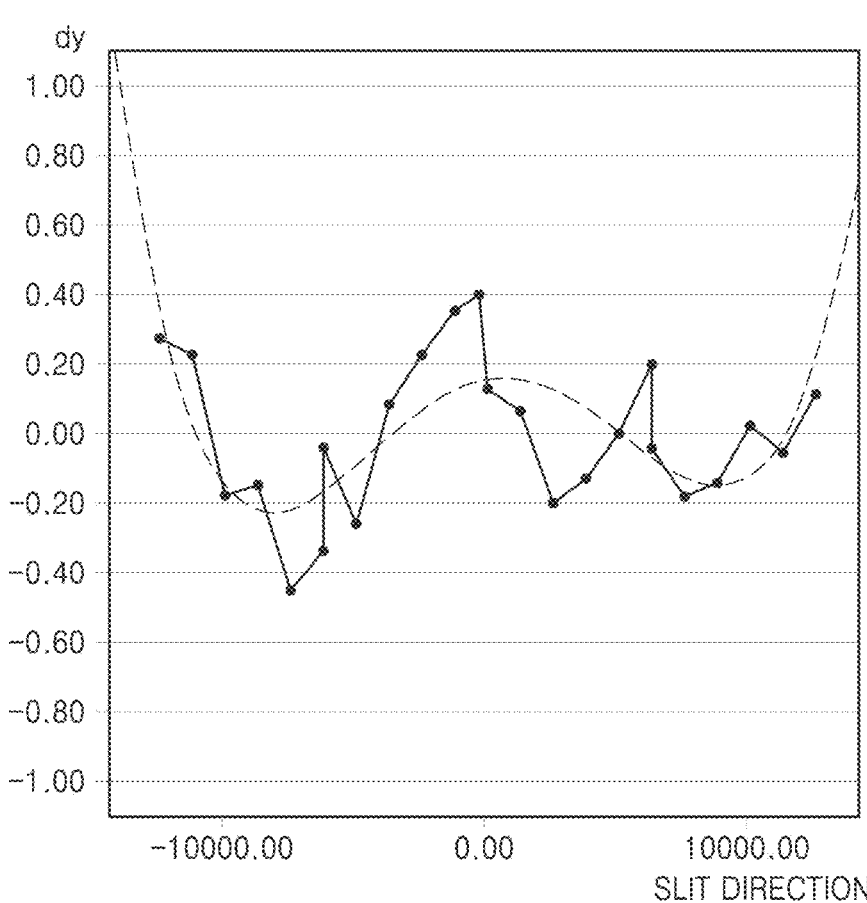
FIGS. 13A through 13C are graphs showing results of correcting an overlay by realizing a conversion logic resulting from a correlation between a first overlay parameter of a 5th order component and a second overlay parameter of a 4th order component.
Figure 13B:
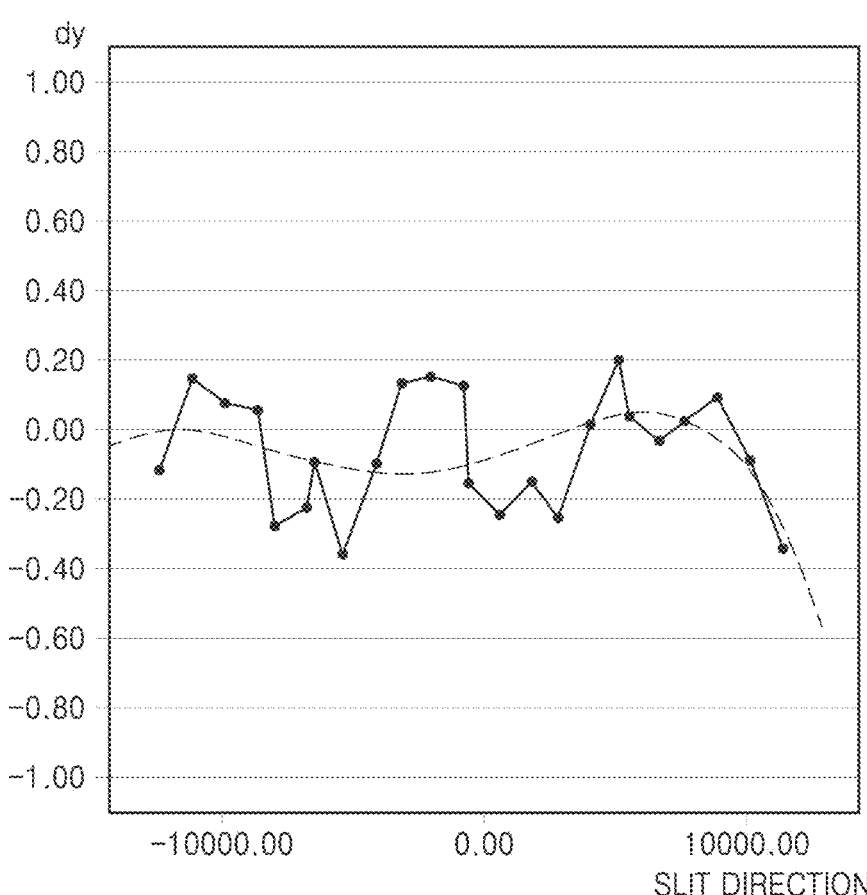
Figure 13C:
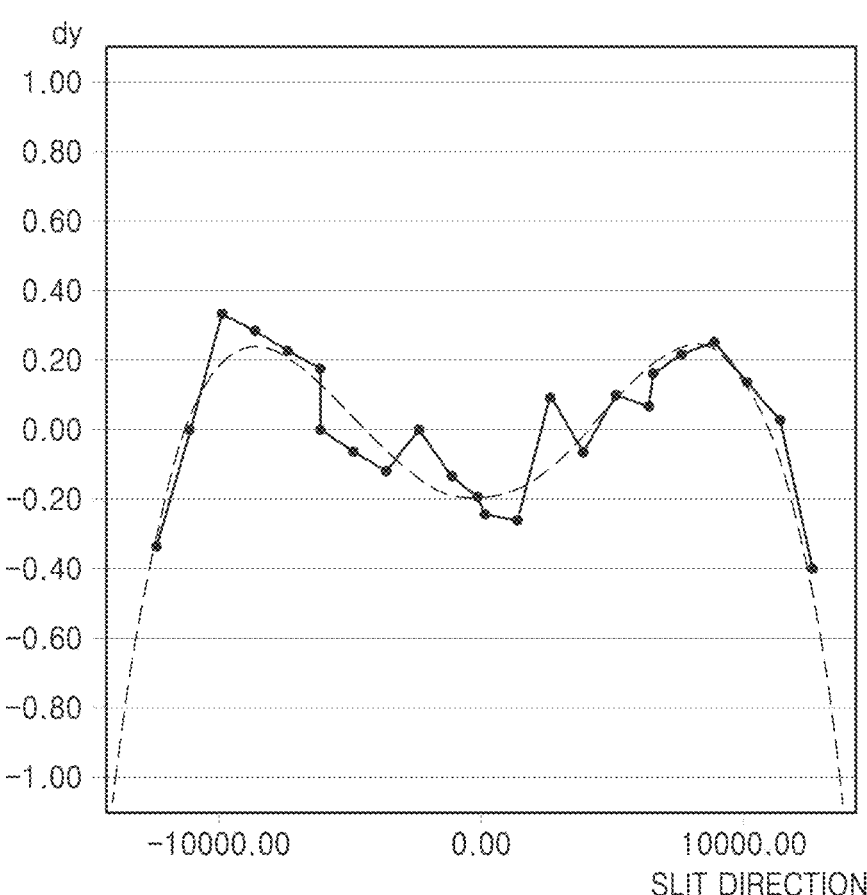

FIGS. 13A through 13C are graphs showing results of correcting an overlay by realizing a conversion logic resulting from the correlation between the first overlay parameter (K31) of a 5th order component and the second overlay parameter (K30) of a 4th order component. FIGS. 13A and 13B are graphs of overlay results respectively before and after the overlay correction method of various example embodiments is applied, and FIG. 13C is a graph showing a difference between the overlay results, e.g., an overlay control level. In the graphs of FIGS. 13A through 13C, a slit direction in the x axis may correspond to an x direction that is an extending direction of a slit, a location of 0.00 may correspond to a center of the slit, and a unit may correspond to an arbitrary unit. dy in the y axis may correspond to a component shifted in a y direction of a pattern, and a unit may correspond to an arbitrary unit. For reference, the curve of the broken line in each of FIGS. 13A through 13C may correspond to a line in which the solid line connecting dots is approximated.

Referring to FIGS. 13A through 13C, a value of dy of the second overlay parameter of the 4th order component, i.e., the overlay parameter of K30, is high and behaves similar to a general 4th order graph, as shown in the graph of FIG. 13A. On the other hand, in the graph of FIG. 13B, the overlay parameter of K30 is corrected through control of the first overlay parameter of the 5th order component, i.e., the overlay parameter of K31, and thus, a value of dy of the overlay parameter of K30 is relatively low. In other words, it is identified that the overlay parameter of K30 is effectively corrected.

Meanwhile, as shown in the graph of FIG. 13C, it is identified that the overlay parameter of K30 is largely corrected at an outer location of the slit in the x direction. Also, it is identified that an approximate graph of a broken line indicating an overlay control level of the overlay correction method of various example embodiments is x axis symmetrical to an approximate graph of a broken line of the overlay parameter of K30 before overlay correction of FIG. 13A. As a result, it is identified that the second overlay parameter of the ultra-high order component may be effectively corrected through the overlay correction method of various example embodiments.

Figure 14:
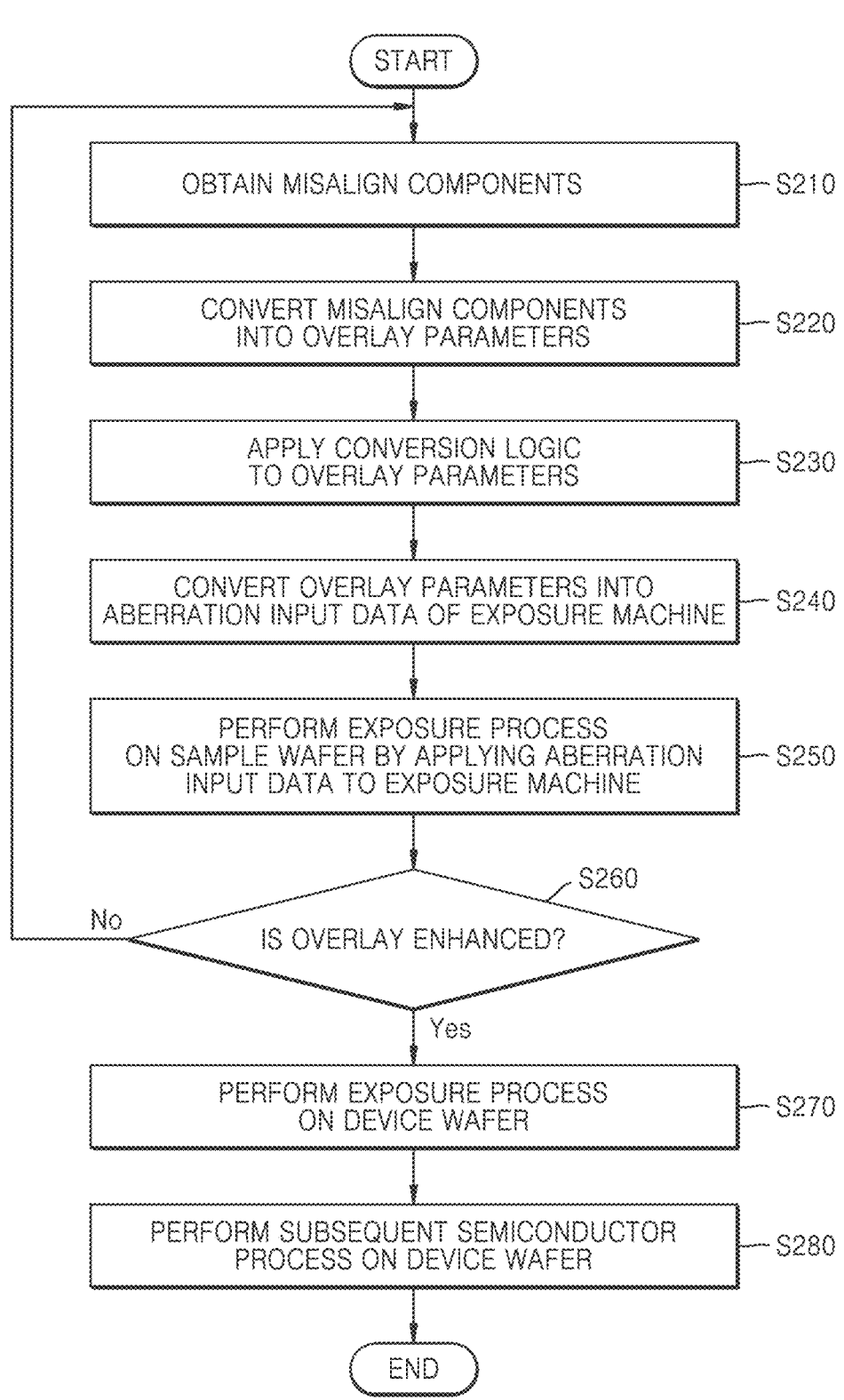
FIG. 14 is a flowchart of a method of manufacturing a semiconductor device including an overlay correction method, according to various example embodiments.

FIG. 14 is a flowchart of a method of manufacturing a semiconductor device including the overlay correction method, according to an embodiment of the inventive concept. Details that have been described above with reference to FIGS. 1 through 13C will be briefly described or omitted.

Referring to FIG. 14, the method of various example embodiments may include obtaining the misalignment components (operation S210) to performing the exposure process (operation S250). The obtaining of the misalignment components (operation S210) to the performing of the exposure process (operation S250) may be substantially the same as the obtaining of the misalignment components (operation S110) to the performing of the exposure process (operation S150) of the overlay correction method of FIG. 2A, respectively. However, in the method of various example embodiments, it is clearly indicated that the exposure process is performed on a sample wafer in operation S250, to be distinguished from a device wafer later.

After operation S250, it is determined whether the overlay is enhanced according to a set criterion (operation S260). When the measured overlay satisfies the set criterion (Yes), the exposure process is performed on the device wafer (operation S270). The device wafer may denote a wafer where a semiconductor device is actually formed. Also, the exposure process may be performed as the aberration input data is applied to the exposure machine. According to an embodiment, operation S260 may be included in the overlay correction method. In this case, the overlay correction method ends when the measured overlay satisfies the set criterion (Yes).

When the measured overlay does not satisfy the set criterion (No), operation S210 is performed to obtain the misalignment components again through measurement and subsequent operations are performed. In operation S260, the misalignment components obtained through the measurement may be used. In this case, operation S220 may be performed instead of operation S210.

After operation S270, a subsequent semiconductor process is performed on the device wafer (operation S280). The subsequent semiconductor process may include various processes. For example, the subsequent semiconductor process may include one or more of a deposition process, an etching process, an ionizing process, and a cleaning process. In addition, the subsequent semiconductor process may include a singulation process of separating the device wafer into semiconductor chips, a test process of testing the semiconductor chips, and a packaging process of packaging the semiconductor chips. A semiconductor device may be completed through the subsequent semiconductor process performed on the device wafer.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While inventive concepts has been particularly shown and described with reference to embodiments thereof, it will be understood that various changes in form and details may be made therein without departing from the spirit and scope of the following claims. Furthermore, example embodiments are not necessarily mutually exclusive with one another. For example, some example embodiments may include one or more features described with reference to one or more figures, and may also include one or more other features described with reference to one or more other figures.

What is claimed is:

1. An overlay improvement method comprising:
obtaining misalignment components of an overlay through measurement;
converting the misalignment components into overlay parameters;

applying a conversion logic between the overlay parameters;
converting the overlay parameters, to which the conversion logic is applied, into aberration input data of an exposure machine; and
performing an exposure process by applying the aberration input data to the exposure machine,
wherein the overlay parameters are divided into a first overlay parameter shifting in a first direction that corresponds to an extension direction of a slit used in the exposure process, and a second overlay parameter shifting in a second direction that is perpendicular to the first direction and corresponds to a scan direction of the exposure process, and
the performing of the exposure process comprises correcting the first overlay parameter and the second overlay parameters, the first overlay parameter and the second overlay parameters including a higher-order component of a 3rd order or greater with respect to a location of the slit in the first direction.

2. The overlay improvement method of claim 1, wherein the first overlay parameter comprises a component of a 4th order or greater with respect to the location of the slit in the first direction, and
the second overlay parameter comprises a component of 3rd order or greater with respect to the location of the slit in the first direction.

3. The overlay improvement method of claim 2, wherein the conversion logic is generated based on a correlation that is dependent on the first overlay parameter of the component of the 4th order or greater and on the second overlay parameter of the component of the 3rd order or greater, and
the correcting of the first overlay parameter and the second overlay parameters comprises correcting the first overlay parameter of up to a 5th order component and the second overlay parameter of up to the 4th order component.

4. The overlay improvement method of claim 2, wherein the first overlay parameter comprises at least one of a 4th order component or a 5th order component,
the second overlay parameter comprises at least one of a 3rd order component or a 4th order component, and
the conversion logic is established between the first overlay parameter of the 4th order component and the second overlay parameter of the 3rd order component or between the first overlay parameter of the 5th order component and the second overlay parameter of the 4th order component.

5. The overlay improvement method of claim 2, wherein the conversion logic results from a correlation ratio of 1:0.9 to 1:0.1 between the first overlay parameter of a component of the 4th order or greater and the second overlay parameter of a component of the 3rd order or greater.

6. The overlay improvement method of claim 5, wherein the conversion logic is established between the first overlay parameter proportional to a fourth power of the location of the slit in the first direction and the second overlay parameter proportional to a third power of the location of the slit in the first direction.

7. The overlay improvement method of claim 5, wherein the conversion logic is established between the first overlay parameter proportional to a fifth power of the location of the slit in the first direction and the second overlay parameter proportional to a fourth power of the location of the slit in the first direction.

8. The overlay improvement method of claim 1, wherein the performing of the exposure process comprises adjusting at least one lens of the exposure machine, based on the aberration input data.

9. The overlay improvement method of claim 8, wherein the converting into the aberration input data comprises:

registering an aberration-wise control sensitivity and a target;

obtaining an aberration measurement value by using an aberration sensor; and generating a lens operating model, based on the aberration-wise control sensitivity, the target, and the aberration measurement value, wherein the registering comprises inputting the overlay parameters to which the conversion logic is applied, and the at least one of lens of the exposure machine is adjusted through the lens operating model.

10. The overlay improvement method of claim 1, further comprising, after the performing of the exposure process:

determining whether the overlay is enhanced, based on a set criterion, wherein the determining comprises, in response to the set criterion being satisfied, ending the overlay improvement method, and in response to the set criterion not being satisfied, performing the obtaining of the misalignment components or the converting into the overlay parameters.

11. An overlay improvement method comprising:

obtaining misalignment components of an overlay through measurement;

converting the misalignment components into overlay parameters;

applying a conversion logic between the overlay parameters;

registering a target, aberration-wise control sensitivity, and the overlay parameters;

obtaining an aberration measurement value by using an aberration sensor;

generating a lens operating model for adjusting at least one lens of an exposure machine, based on the target, the aberration-wise control sensitivity and the aberration measurement value; and performing an exposure process by adjusting the at least one lens of the exposure machine through the lens operating model, wherein the overlay parameters are divided into a first overlay parameter shifting in a first direction that corresponds to an extension direction of a slit used in the exposure process, and a second overlay parameter shifting in a second direction that is perpendicular to the first direction and corresponds to a scan direction of the exposure process, and the performing of the exposure process comprises correcting the first overlay parameter and the second overlay parameters including a higher-order component of a 3rd order or greater with respect to a location of the slit in the first direction.

12. The overlay improvement method of claim 11, wherein the first overlay parameter comprises a component of a 4th order or greater with respect to the location of the slit in the first direction, and the second overlay parameter comprises a component of the 3rd order or greater with respect to the location of the slit in the first direction.

13. The overlay improvement method of claim 12, wherein the conversion logic is established between the first overlay parameter proportional to a fourth power of the location of the slit in the first direction and the second overlay parameter proportional to a third power of the location of the slit in the first direction.

14. The overlay improvement method of claim 12, wherein the conversion logic is established between the first overlay parameter proportional to a fifth power of the location of the slit in the first direction and the second overlay parameter proportional to a fourth power of the location of the slit in the first direction.

15. A method of manufacturing a semiconductor device, the method comprising:

obtaining misalignment components of an overlay through measurement;

converting the misalignment components into overlay parameters;

applying a conversion logic between the overlay parameters;

converting the overlay parameters, to which the conversion logic is applied, into aberration input data of an exposure machine;

performing an exposure process on a sample wafer by applying the aberration input data to the exposure machine;

determining whether the overlay is enhanced, based on a set criterion;

performing the exposure process on a device wafer in response to the set criterion being satisfied; and performing a subsequent semiconductor process on the device wafer, wherein the overlay parameters are divided into a first overlay parameter shifting in a first direction that corresponds to an extension direction of a slit used in the exposure process, and a second overlay parameter shifting in a second direction that is perpendicular to the first direction and corresponds to a scan direction of the exposure process, and the performing of the exposure process on the sample wafer or the device wafer comprises correcting the first overlay parameter and the second overlay parameters including a higher-order component of a 3rd order or greater with respect to a location of the slit in the first direction.

16. The method of claim 15, wherein the first overlay parameter comprises a component of a 4th order or greater with respect to the location of the slit in the first direction, and the second overlay parameter comprises a component of the 3rd order or greater with respect to the location of the slit in the first direction.

17. The method of claim 15, wherein the conversion logic results from a correlation ratio of 1:0.9 to 1:0.1 between the first overlay parameter of a component of a 4th order or greater with respect to the location of the slit in the first direction and the second overlay parameter of a component of the 3rd order or greater with respect to the location of the slit in the first direction.

18. The method of claim 17, wherein the conversion logic is established between the first overlay parameter proportional to a fourth power of the location of the slit in the first direction and the second overlay parameter proportional to a third power of the location of the slit in the first direction.

19. The method of claim 17, wherein the conversion logic is established between the first overlay parameter proportional to a fifth power of the location of the slit in the first direction and the second overlay parameter proportional to a fourth power of the location of the slit in the first direction.

20. The method of claim 15, wherein the converting into the aberration input data comprises:

registering an aberration-wise control sensitivity and a target;

obtaining an aberration measurement value by using an aberration sensor; and generating a lens operating model, based on the aberration-wise control sensitivity, the target, and the aberration measurement value, wherein the registering comprises inputting the overlay parameters to which the conversion logic is applied, and the performing of the exposure process on the sample wafer comprises adjusting at least one lens of the exposure machine through the lens operating model.

* * * * *